Figure 1:
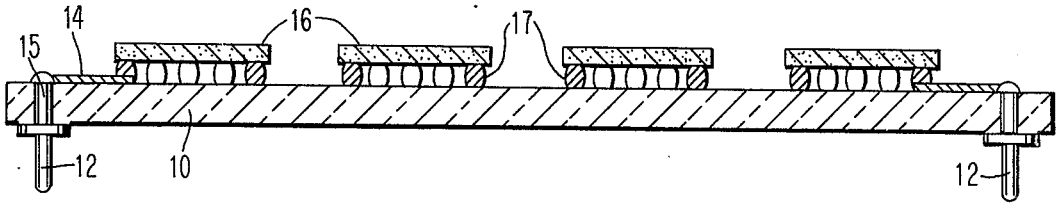
Figure 2:
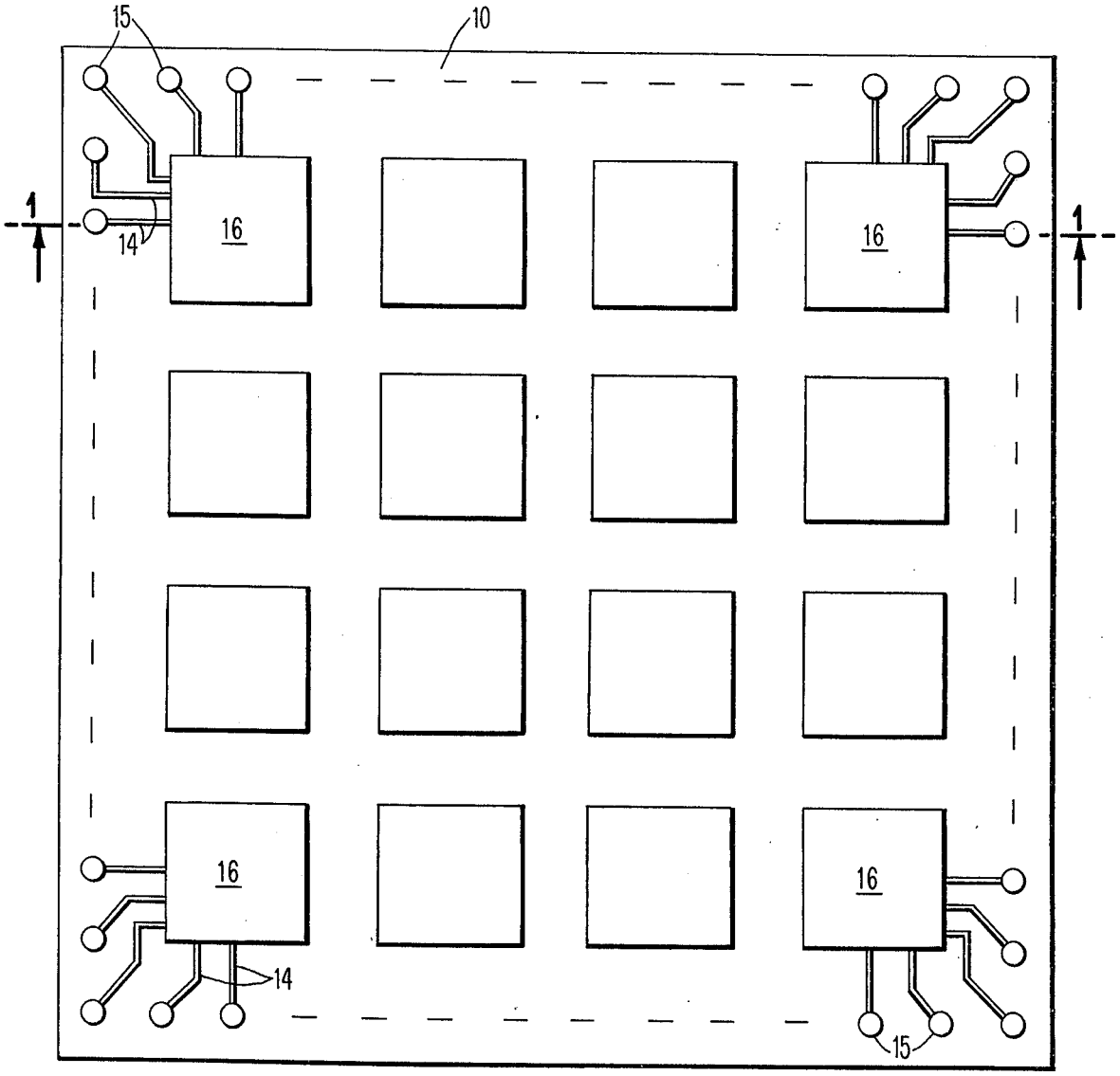
Figure 3:
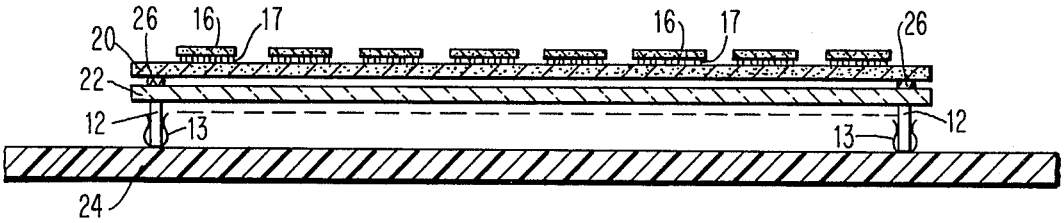
Figure 4:
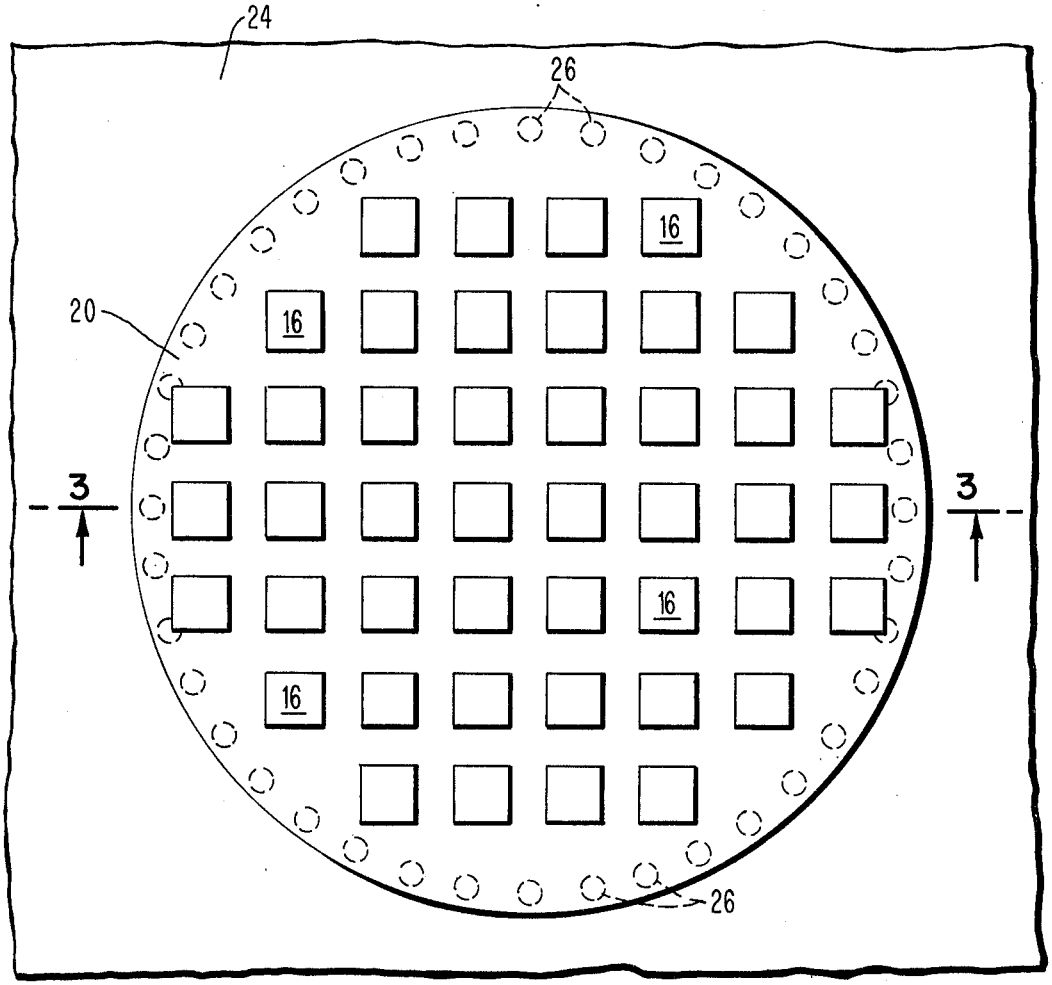

United States Defensive Publication [19] (H) [11] T955,008

Gregor et al. [43] Feb. 1, 1977

[54] FLIP CHIP STRUCTURE INCLUDING A SILICON SEMICONDUCTOR ELEMENT BONDED TO AN $Si_3N_4$ BASE SUBSTRATE

[75] Inventors: Lawrence V. Gregor, Hopewell Junction; Robert G. Shepheard, Fishkill, both of N.Y.

[73] Assignee: International Business Machines Corporation, Armonk, N.Y.

[21] Appl. No.: 693,385

[22] Filed: June 7, 1976

Related U.S. Application Data

[63] Continuation of Ser. No. 498,487, Aug. 19, 1974, abandoned.

[51] Int. Cl.[2] ..... H01L 39/02; H01L 29/04; H01L 23/48; H01L 29/40

[52] U.S. Cl. ..... 357/80; 357/59; 357/65; 357/68; 174/52 S; 317/101 CC

[57] ABSTRACT

A semiconductor device and carrier assembly package having a silicon integrated circuit semiconductor device provided with at least three raised electrical contacts on a first surface, a device support substrate of $Si_3N_4$ provided with a conductive metallurgy pattern on at least one surface, the conductive pattern including an electrical contact configuration matching the raised electrical contacts on the device, metallurgical bonds between the raised electrical contacts on the device and the electrical contact pattern on the support substrate, and an electrically conductive means for electrically connecting elements of the conductive metallurgy pattern to coacting elements off the support substrate.

8 Claims, 2 Sheets Drawing,

13 Pages Specification

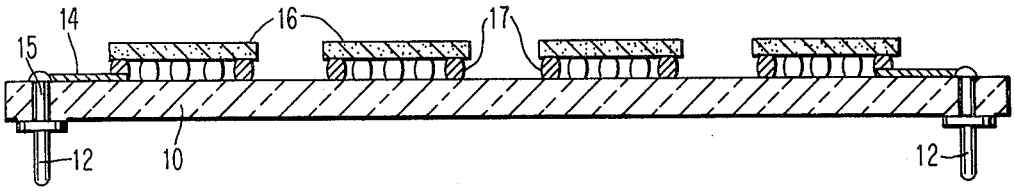

The file of this unexamined application may be inspected and copies thereof may be purchased (849 O.G. 1221, Apr. 9, 1968).